June 26, 1956 E. F. LOSCO 2,752,541

SEMICONDUCTOR RECTIFIER DEVICE

Filed Jan. 20, 1955

WITNESSES

INVENTOR
Ezekiel F. Losco
BY
ATTORNEY 2,752,541

SEMICONDUCTOR RECTIFIER DEVICE

Ezekiel F. Losco, Whitehall, Pa., assignor to Westinghouse Electric Corporation, East Pittsburgh, Pa., a corporation of Pennsylvania Application January 20, 1955, Serial No. 483,072

6 Claims. (Cl. 317—234)

Figure 1:
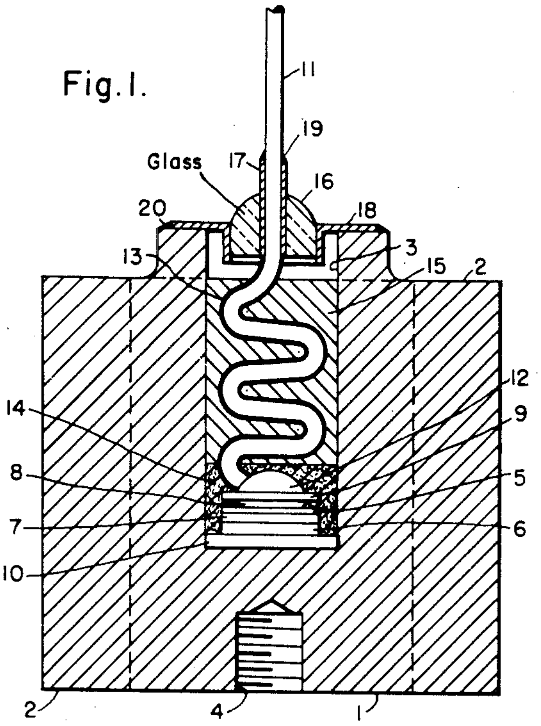

The present invention relates to semiconductor devices, and more particularly to an encapsulated semiconductor rectifier device.

The invention is particularly suitable for the encapsulation of semiconductor rectifier devices of the p-n junction type, and especially silicon rectifiers, although its usefulness is not necessarily restricted to this specific application and it may also be used with other types of semiconductor devices. Semiconductor materials, such as germanium and silicon, may exist in either of two conductivity types, depending upon the treatment of the material and the presence of extremely small amounts of certain impurities. N-type material is characterized by an excess of electrons and its conductivity is due to the presence of these electrons. P-type material is characterized by a deficiency of electrons in the crystal structure of the material, resulting in so-called holes, and the conductivity of the material is due to an apparent movement of these holes, which act like positive charges. If a body of semiconductor material has adjoining zones of n-type and p-type material, the junction between the two zones acts as a rectifying barrier or layer, since it permits current to flow freely from the p-type material to the n-type material, but presents a very high resistance to current flow in the reverse direction, so that only an extremely small leakage current can flow.

These p-n junction rectifiers have very desirable characteristics, since they can carry currents of high current density in the forward direction and are capable of withstanding relatively high voltages in the reverse direction. These devices, therefore, are very suitable for use as power rectifiers, and can handle relatively large amounts of power. It is usually necessary to hermetically seal or encapsulate these devices in order to protect the junction from moisture, which has a very adverse effect on the characteristics of the device, and the problem of encapsulating semiconductor power rectifiers has been quite troublesome, especially in the case of silicon rectifiers which may operate at relatively high temperatures.

A satisfactory encapsulation of silicon rectifiers requires enclosing the device in a sealed structure of a material, or a combination of materials, which in addition to protecting the rectifier against moisture also meets other severe requirements. Thus, the structure must be able to withstand either continuous or intermittent operation at temperatures well in excess of 200° C., and must be capable of withstanding temperature cycling over a very wide temperature range, without structural damage and without damage to the fragile semiconductor device due to differences in thermal expansion, or other causes. The structure must also have sufficient flexibility to permit manufacturing operations, such as soldering, to be performed at still higher temperatures without damage to the semiconductor device, and it must be such that the semiconductor is adequately protected against mechanical stresses or shocks. The encapsulating means must also provide effective electrical insulation for the rectifier, and must provide a mechanically rigid construction for mechanical protection, as well as providing for good heat transfer from the semiconductor, since these devices have rather definite temperature limits and effective dissipation of heat is necessary in order to realize high power ratings. It will be evident, therefore, that the problem of encapsulating silicon rectifiers involves numerous difficulties.

The principal object of the present invention is to provide an encapsulated semiconductor device which meets the requirements outlined above.

Another object of the invention is to provide an encapsulated silicon rectifier which is capable of operation at high temperature, and over a wide temperature range, without damage to the rectifier itself or deterioration of its characteristics, and with good heat dissipation to permit high power rating.

A further object of the invention is to provide a semiconductor rectifier device enclosed in a metal radiator, with relatively flexible insulating material surrounding the rectifier device itself, and with metal encapsulating means for protecting the rectifier and providing a rigid enclosing structure with good heat dissipating characteristics.

Figure 2:
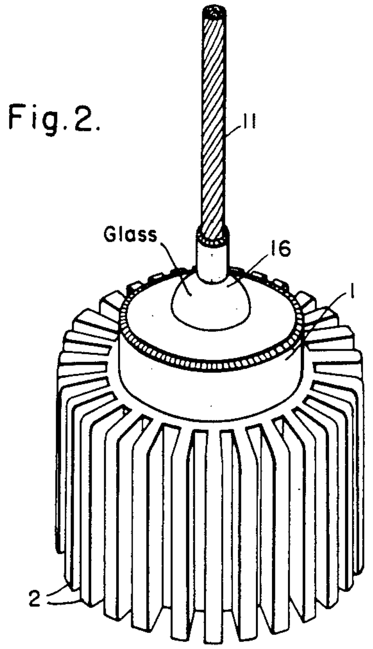

Other objects and advantages of the invention will be apparent from the following detailed description, taken in connection with the accompanying drawing, in which:

Figure 1 is a vertical sectional view of an encapsulated rectifier unit embodying the invention; and Fig. 2 is a perspective view of the rectifier unit.

As previously indicated, the invention is applicable to semiconductor devices of any type, but is particularly suitable for p-n junction rectifiers and especially silicon rectifiers, and is shown in the drawing as applied to a device of this type. The rectifier device shown in the drawing is mounted in a metal radiator 1, preferably of copper, comprising a body which may be cylindrical in shape and which is provided with radial fins 2 or other suitable means for dissipating heat from the body of the radiator. The radiator 1 has a central hollow 3 and may be provided with a tapped hole 4 for mounting the device or for attaching a bus bar or other electrical lead.

The semiconductor rectifier device itself is disposed in the hollow 3 of the radiator 1 and may be of any suitable type. The rectifier device is shown in Fig. 1, the thicknesses of the various components being greatly exaggerated for clarity, and consists of a body of semiconductor material 5, which is preferably silicon although other suitable semiconductor material such as germanium might be used. The semiconductor 5 is preferably in the form of a thin wafer and it is mounted on a metal contact plate or terminal plate 6 by means of a suitable solder 7 which forms an ohmic contact between the plate 6 and the semiconductor 5 and which secures the semiconductor to the plate with a permanent joint of good thermal and electrical conductivity.

The semiconductor 5 is preferably n-type material and a rectifying junction is formed in it by applying a so-called acceptor impurity material 8 which is capable of converting the semiconductor material to p-type. Aluminum is preferably used as an acceptor material with silicon, although other suitable materials might be used, such as indium if the semiconductor material is germanium. The acceptor material 8 is applied on the surface of the semiconductor material 5 and alloys with the surface layer of semiconductor and diffuses into it to convert a portion of the material to p-type, thus forming a rectifying junction. A metal terminal plate or contact plate 9 is applied to the acceptor material 8 and is joined to it to form a permanent joint of good electrical and thermal conductivity. The metal terminal plates 6 and 9 are provided for mechanical support of the relatively fragile semiconductor material and to provide for electrical contact to it, and they are preferably made of molybdenum because of its relatively good thermal conductivity and because its thermal expansion is close to that of both silicon and germanium.

The semiconductor rectifier is made as a unitary cell, as described above. The complete rectifier cell is placed in the hollow 3 of the copper radiator 1 and the lower terminal plate 6 is joined to the bottom surface of the hollow by a layer of solder 10, which permanently secures the cell to the radiator with a connection of good thermal conductivity. A flexible conductor or lead 11 is soldered to the top terminal plate 9, as indicated at 12, and extends out of the top of the hollow 3. The conductor 11 is a flexible conductor of any suitable type and the portion of the conductor within the hollow 3 above the solder 12 is covered with a suitable heat-resistant insulating material 13, preferably silicone rubber or a material of equivalent characteristics. The insulated portion of the conductor 11 within the hollow 3 is formed into a substantially zigzag configuration, as shown in Fig. 1, so that it has considerable flexibility to minimize any mechanical stresses that might be applied to the semiconductor through the conductor 11.

After the semiconductor rectifier cell has been soldered in the hollow 3 and the conductor 11 soldered to it, which may be done simultaneously, the rectifier cell is encased in a mass of more or less flexible insulating material. For this purpose, a finely divided, heat-resistant insulating material 14 is used and the preferred material is magnesium oxide, although other insulating materials of similar characteristics might be utilized. The magnesium oxide is finely divided, preferably of the order of 600 mesh, and it is applied by mixing it with methyl alcohol to form a thin slurry. This mixture is poured into the hollow 3 of the radiator 1 to a depth sufficient to cover the rectifier cell itself and the exposed lower end of the conductor 11, so that all the metallic components are completely covered by the magnesium oxide, as shown in Fig. 1. It is preferred to use an alcohol slurry of the magnesium oxide in order to insure that no moisture will be present and that no water vapor can come in contact with the rectifier junction, since even relatively small traces of moisture have a very adverse effect on the rectifying characteristics of the junction.

After the slurry has been poured into the hollow 3, the alcohol is volatilized and removed by heating the device, preferably at a temperature of the order of 150° C. for about a half hour to completely drive off all the alcohol. When the mixture is thus dried, the finely divided magnesium oxide remains in the radiator as a partially compacted mass packed around the rectifier cell, the mass being essentially a caked powder. Thus, the material is not completely solid, but is sufficiently porous to have some flexibility so as to permit expansion and contraction of the rectifier cell due to temperature changes without imposing substantial mechanical stresses on the semiconductor.

After the magnesium oxide has thus been applied, and preferably without allowing the device to cool below 100° C., so as to prevent any trace of moisture remaining in the device, the hollow 3 is filled with a metal 15. Any suitable metal of relatively low melting point may be utilized, and it has been found that pure tin is a very suitable material for this purpose. The tin 15 is melted and poured into the hollow 3 to substantially fill the hollow above the magnesium oxide. The partially compacted, finely divided magnesium oxide is sufficiently porous to have some flexibility, as explained above, but it is not sufficiently porous to allow the molten tin to penetrate, so that the rectifier cell itself is protected and insulated from the metal. Upon cooling, the tin forms a solder joint with the surrounding copper wall of the radiator 1, and forms a rigid supporting structure for the rectifier cell which is thus completely enclosed in a rigid metal structure. During solidification of the tin 15, it tends to shrink away from the conductor 11, so that the conductor retains some flexibility which is desirable to prevent any possibility of mechanical stresses being applied to the rectifier cell by the conductor.

The device is completed by closing and sealing the upper end of the hollow 3. This may be done by sealing the conductor 11 in place by means of a glass bushing 16 fused to an inner sleeve 17 and an outer flange 18. The sleeve 17 and flange 18 may be made of a metal which forms a permanent, air-tight seal with glass, and the inner sleeve 17 is soldered to the conductor 11 at 19 while the flange 18 is soldered to the upper surface of the radiator 1 at 20. In this way, the device is completely hermetically sealed and the lead 11 is insulated from the radiator by the bushing 16.

It will be apparent that the construction of this rectifier device is such that the requirements previously outlined are fully met. Thus, the rectifier cell is completely hermetically sealed and is enclosed in a rigid structure which supports it and protects it from mechanical stresses or shocks. The rectifier cell itself is adequately insulated from the metal enclosure, and the insulation provides sufficient flexibility to allow for thermal expansion without imposing substantial mechanical stresses on the cell. Thus, the device is capable of operation at high temperature, or of temperature cycling over a wide range, without any harmful effect on the rectifier cell. The semiconductor device is in good heat transfer relation to the surrounding metal enclosure, since it is soldered directly to the radiator, so that heat flows to the body of the radiator, which has high thermal capacity, and is dissipated by the fins 2, or other cooling means, so that relatively high currents can be carried without exceeding the temperature limit. Thus, an encapsulated semiconductor rectifier device is provided which is suitable for the most severe conditions of service.

A specific embodiment of the invention has been shown and described for the purpose of illustration, but it will be obvious that other embodiments are possible and that various modifications may be made within the scope of the invention.

I claim as my invention:

1. In combination, a metal body having a hollow therein, a semiconductor device disposed in the hollow, said semiconductor device having metal terminal members, means for securing one of the terminal members to the metal body with a joint of good thermal and electrical conductivity, a flexible insulated conductor attached to another of said terminal members and extending out of the hollow, a mass of finely divided heat-resistant insulating material in the hollow completely covering the semiconductor device, a mass of metal substantially filling the hollow above the insulating material, and means for closing and sealing the hollow.

2. In combination, a metal body having a hollow therein, a semiconductor device disposed in the hollow, said semiconductor device having metal terminal members, means for securing one of the terminal members to the metal body with a joint of good thermal and electrical conductivity, a flexible insulated conductor attached to another of said terminal members and extending out of the hollow, a mass of finely divided, partially compacted magnesium oxide in the hollow completely covering the semiconductor device, a mass of metal substantially filling the hollow above the insulating material, and means for closing and sealing the hollow.

3. A semiconductor rectifier device comprising a metal body having a hollow therein, a body of semiconductor material disposed within the hollow, said body of semiconductor material having adjoining zones of opposite conductivity type forming a rectifying junction and having metal terminal members on opposite sides thereof, means for securing one of the terminal members to the metal body with a joint of good thermal and electrical conductivity, a flexible insulated conductor attached to the other terminal member and extending out of the hollow, a mass of finely divided heat-resistant insulating material in the hollow completely covering the semiconductor body and terminal members, a mass of metal substantially filling the hollow above the insulating material, and means for closing and sealing the hollow.

4. A semiconductor rectifier device comprising a metal body having a hollow therein, a body of semiconductor material disposed within the hollow, said body of semiconductor material having adjoining zones of opposite conductivity type forming a rectifying junction and having metal terminal members on opposite sides thereof, means for securing one of the terminal members to the metal body with a joint of good thermal and electrical conductivity, a flexible insulated conductor attached to the other terminal member and extending out of the hollow, a mass of finely divided, partially compacted magnesium oxide in the hollow completely covering the semiconductor body and terminal members, a mass of metal substantially filling the hollow above the insulating material, and means for closing and sealing the hollow.

5. A semiconductor rectifier device comprising a metal body having a hollow therein, a body of semiconductor material disposed within the hollow, said body of semiconductor material having adjoining zones of opposite conductivity type forming a rectifying junction and having metal terminal members on opposite sides thereof, means for securing one of the terminal members to the metal body at the bottom of the hollow with a joint of good thermal and electrical conductivity, a flexible insulated conductor attached to the other terminal member and extending out of the hollow, a mass of finely divided, partially compacted magnesium oxide filling the bottom of the hollow to a level above the semiconductor body to completely cover the semiconductor body and terminal members, a mass of metal substantially filling the hollow above the magnesium oxide, and means for closing and sealing the hollow.

6. A semiconductor rectifier device comprising a metal body having a hollow therein, a body of semiconductor material disposed within the hollow, said body of semiconductor material having adjoining zones of opposite conductivity type forming a rectifying junction and having metal terminal members on opposite sides thereof, means for securing one of the terminal members to the metal body at the bottom of the hollow with a joint of good thermal and electrical conductivity, a flexible insulated conductor attached to the other terminal member and extending out of the hollow, a mass of finely divided, partially compacted magnesium oxide filling the bottom of the hollow to a level above the semiconductor body to completely cover the semiconductor body and terminal members, a mass of metal substantially filling the hollow above the magnesium oxide, said insulated conductor passing through the mass of metal and being formed to a substantially zigzag configuration, and means for closing and sealing the hollow.

References Cited in the file of this patent

UNITED STATES PATENTS 2,197,115 Randolph et al. ---------- Apr. 16, 1940
2,712,619 Zetwo ------------------- July 5, 1955

FOREIGN PATENTS 1,050,940 France ----------------- Sept. 9, 1953